US005773891A

United States Patent [19]

Delgado et al.

[11] Patent Number: 5,773,891
[45] Date of Patent: Jun. 30, 1998

[54] INTEGRATED CIRCUIT METHOD FOR AND STRUCTURE WITH NARROW LINE WIDTHS

[75] Inventors: Jose Avelino Delgado, Palm Bay; Stephen Joseph Gaul, Melbourne, both of Fla.

[73] Assignee: Harris Corporation, Melbourne, Fla.

[21] Appl. No.: 460,993

[22] Filed: Jun. 5, 1995

Related U.S. Application Data

[62] Division of Ser. No. 66,355, May 21, 1993, Pat. No. 5,639,688.

[51] Int. Cl.[6] .................. H01L 29/74; H01L 31/0328; H01L 29/76; H01L 29/94
[52] U.S. Cl. ................ 257/754; 257/401; 257/134; 257/197; 257/287; 257/288
[58] Field of Search .................. 257/754, 336, 257/401, 40, 382, 134, 197, 287, 288; 437/40 RG, 41 RG, 162, 40 R, 41 R, 44, 60

[56] References Cited

U.S. PATENT DOCUMENTS

| | | |
|---|---|---|
| 4,946,550 | 8/1990 | Van Laarhoven . |
| 4,968,646 | 11/1990 | Blanchard et al. ............ 437/41 R |
| 4,970,177 | 11/1990 | Mizushima . |
| 5,049,515 | 9/1991 | Tzeng . |
| 5,057,899 | 10/1991 | Samata et al. .............. 257/754 |
| 5,137,837 | 8/1992 | Chang et al. . |
| 5,196,373 | 3/1993 | Beasom . |
| 5,242,846 | 9/1993 | Izumi et al. . |
| 5,378,646 | 1/1995 | Huang et al. . |

FOREIGN PATENT DOCUMENTS

| | | |
|---|---|---|
| 56-29342 A | 3/1981 | Japan . |
| 62-211950 A | 9/1987 | Japan . |
| 2-219271 A | 8/1990 | Japan . |
| 3-34462 A | 2/1991 | Japan . |
| 4-29983 A | 10/1992 | Japan . |

OTHER PUBLICATIONS

S. Wolf, "Silicon Processing For The VLSI Era", vol. 2, Process Integration, pp. 214–217, 1990.

*Primary Examiner*—Mahshid D. Saadat
*Assistant Examiner*—Jhihan B. Clark
*Attorney, Agent, or Firm*—Jaeckle Fleischmann & Mugel, LLP

[57] ABSTRACT

In a sub-micron line width process, a first layer of polysilicon 13 is patterned into lines 1,2 spaced a predetermined distance. An oxide layer 11 is deposited. A second layer of polysilicon 14 is deposited on the insulating layer. A gate contact 19 or emitter contact 35 is formed from the second polysilicon layer 14. The gate 19 or emitter 35 is spaced from the lines 1,2 a distance approximately equal to the thickness of the second polysilicon layer 14.

21 Claims, 4 Drawing Sheets

NPN TRANSISTOR

INTEGRATED CIRCUIT METHOD FOR AND STRUCTURE WITH NARROW LINE WIDTHS

This is a division of application Ser. No. 08/066,355 filed on May 21, 1993, U.S. Pat. No. 5,639,688.

FIELD OF THE INVENTION

The present invention relates in general to integrated circuits and methods for manufacturing integrated circuits, in particular to methods and circuits having narrow line widths of the order of 1 micron or less.

BACKGROUND

Since the invention of integrated circuits, many improvements have been made in reducing the size of components of integrated circuits as well as increasing the speed of those components. At present, it is common for integrated circuits to have minimum features with lengths as short as 1 micron. Sub-micron features are currently in production and will soon be commonplace.

The size of features on an integrated circuit is highly dependent upon the apparatus used to fashion such features. Most integrated circuits are fashioned using an optical lithography apparatus including projection aligners and reduction steppers. Projection aligners simultaneously expose an entire wafer to an optical mask. However, when using standard photoresists, the minimum line width of such aligners is about two microns. In order to achieve smaller geometries of 1 micron or less, the optical lithography tool most often used is an optical reduction stepper. Such equipment is very expensive and tends to obsolete existing projection aligners. Steppers expose only a predetermined field on a given wafer to an optically reduced mask. The wafer is then stepped beneath an exposure station so that the field of exposure may be stepwise repeatedly exposed on the wafer.

A number of techniques have also been proposed for sub-micron lithography including the use of electron beam lithography. However, electron beam lithography is slow and requires expensive electron beam equipment. Another technique is x-ray lithography. However, x-ray lithography equipment is also expensive and is still in its developmental stage. Still another solution relies upon the use of phase shift masking to achieve narrow lines at reduced expense. However, there remains an unmet desire for a method that can use a projection aligner with ordinary photoresist to achieve sub-micron geometries of features including geometries of ½ micron or less.

SUMMARY OF THE INVENTION

In accordance with this invention, sub-micron geometries are accomplished using a two level polysilicon method. Using this method, the spacing between first level polysilicon lines and the thickness of the second polysilicon level controls the line width of features formed with the second level of polysilicon material. The approximate spacing between first level polysilicon lines is on the order of 2 microns, which is readily obtainable using projection alignment techniques. As the deposition and thickness control of polysilicon is a well known and well regulated technique, it is possible to accurately and precisely control the resulting line width of the second level polysilicon. This technique allows the production of sub-micron widths of critical components such as MOS and JFET gates and bipolar emitters without the use of expensive photolithography.

More specifically, a first level of polysilicon is deposited over noncritical areas such as substrate source and drain regions or extrinsic base regions. The first level of polysilicon can be patterned in accordance with acceptable projection aligner tolerances, e.g. two microns spacing between adjacent lines or strips of polysilicon. The first level polysilicon is patterned and provides a contoured surface on the semiconductor substrate. A second level of polysilicon is conformally deposited over the first level and the second level of polysilicon has a controllable thickness. The thickness of the second level of polysilicon in conjunction with the first polysilicon spacing controls the width of the gate structure and the width of the emitter structure which are fashioned from the second level of polysilicon.

In a preferred metal oxide semiconductor process, an oxide is thermally grown or deposited on top of a first level of polysilicon. The polysilicon is then patterned into lines or strips of a predetermined distance apart, for example, two microns. These lines of polysilicon are disposed over regions corresponding to the source and drain of an MOS transistor. A gate dielectric is then formed on the section of the substrate between the lines of polysilicon and on the sidewall regions of the polysilicon lines.

A second level of polysilicon is then deposited after the gate dielectric is formed. This second, conformal layer of polysilicon has a precisely controlled thickness. As the second polysilicon layer becomes thicker, it gradually narrows the space between the two first polysilicon lines. As such, a second polysilicon layer having a thickness of 0.75 microns will result in a gap approximately 0.5 micron wide, assuming a first polysilicon spacing of 2 microns. After the second polysilicon layer is deposited, the gaps in the polysilicon are filled with a suitable masking material, such as photoresist or spin-on-glass. Techniques such as those described in U.S. patent application Ser. No. 939,115, filed Sep. 1, 1992 and assigned to the same assignee as this application, can be used to eliminate unwanted masking material from the top surfaces of the second polysilicon level. The second level of polysilicon is then etched, preferably anisotropically, until the gate dielectric is exposed. After that etching process, the region masked by the photoresist or spin-on-glass will be approximately the width of the distance between the lines of the first polysilicon layer less two times the thickness of the deposited second polysilicon layer. As such, the spacing between opposite sidewalls of a first polysilicon layer is reduced by two times the thickness of a second polysilicon layer.

The foregoing process and technique is adaptable to the manufacture of NMOS devices, PMOS devices and CMOS devices. It can also be adapted for the production of JFETs and bipolar transistors. With bipolar transistors, the first level of polysilicon is used to form the extrinsic base. The second level of polysilicon forms the emitter. The bipolar process disclosed herein is compatible with the MOS process so that BICMOS devices may be fabricated using the inventive method.

DETAILED DESCRIPTION

The formation of integrated circuits is a process of building devices in a single piece of semiconductor crystal, preferably silicon crystal. It is a process of building successive layers of insulating, conducting, and semiconducting materials.

Each layer is patterned to give a distinct formation in relationship with surrounding and subsequent layers. Those skilled in the art will understand that layers are produced and patterned by using many known techniques.

The following description will refer to FIGS. 1–4. This description will include general techniques for carrying out the inventive steps and creating the inventive structures of this invention. These particular techniques and structures are applicable to well-known MOS and bipolar circuit fabrication techniques. As such, those individual techniques will be described in more detail later.

Figure 1:
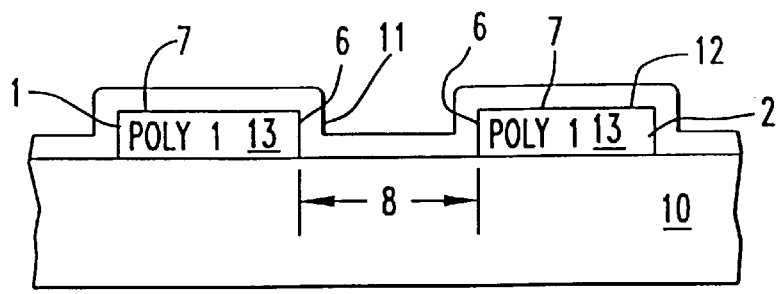
FIG. 1 diagrammatically illustrates a semiconductor structure having a first level of conductive material divided into at least two lines spaced apart from each other and covered by an insulating layer.
Figure 2:
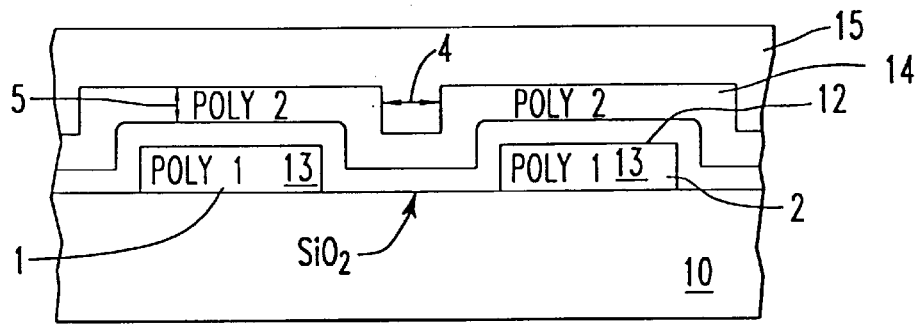
FIG. 2 shows the structure of FIG. 1 in which a second conductive layer and a resist layer have been applied.
Figure 3:
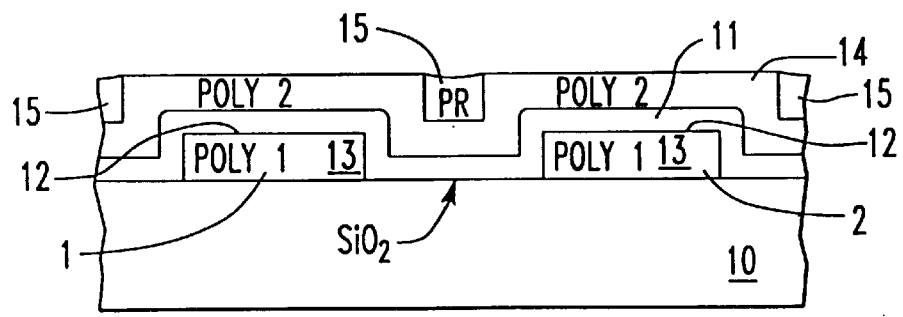
FIG. 3 shows the structure of FIG. 2 after a planarization step.

With reference to FIG. 1, there is generally shown a semiconductor substrate 10. The substrate 10 is preferably of silicon but may be of any other suitably semiconductive material including gallium arsenide. It is understood that the substrate 10 may have one or more epitaxial upper layers as well as heavily doped buried layers that are not shown in the drawings. Substrate 10 is first prepared by a uniform deposition of a first layer of compatible conductive material 13. In the preferred embodiment, this material comprises polysilicon. A buffer material 12 is next deposited on top of the polysilicon 13. In the preferred embodiment this material comprises oxide, which may either be thermally grown and/or deposited. The layers of oxide 12 and polysilicon 13 are then suitably patterned and etched to form two lines, 1, 2. The lines or strips 1, 2 are spaced apart a predetermined distance within the tolerance of a projection aligner, e.g. two microns.

The lines 1, 2, and region 8 between the two lines are then covered by a suitable dielectric material 11 which will serve as a gate dielectric. In the preferred embodiment the gate dielectric 11 is oxide with a thickness of several hundred angstroms, which is thermally grown and/or deposited. The resulting structure, shown in FIG. 1 has the thin gate dielectric in the region 8 between the two lines and also in the polysilicon sidewall regions 6. The top 7 of the polysilicon lines are coated with the previously formed buffer material 12 and the additional gate dielectric 11.

Next, a second conductive layer 14, preferably of polysilicon is conformally deposited on the entire substrate 10. This second layer 14 has a thickness 5. The second layer 14, due to its conformal nature, has a spacing 4 between the sidewalls of the second layer 14 that are themselves disposed between sidewalls of the first layer 13. The spacing 4 is a function of the thickness 5 of layer 14 and the spacing of lines 1,2. A further layer 15 of suitable resist material, such as photoresist or spin-on-glass, is uniformly applied to the surface of the substrate. Thereafter, as better shown in FIG. 3, the resist layer 15 is planarized to expose the upper surface of the second polysilicon layer 14.

Figure 4:
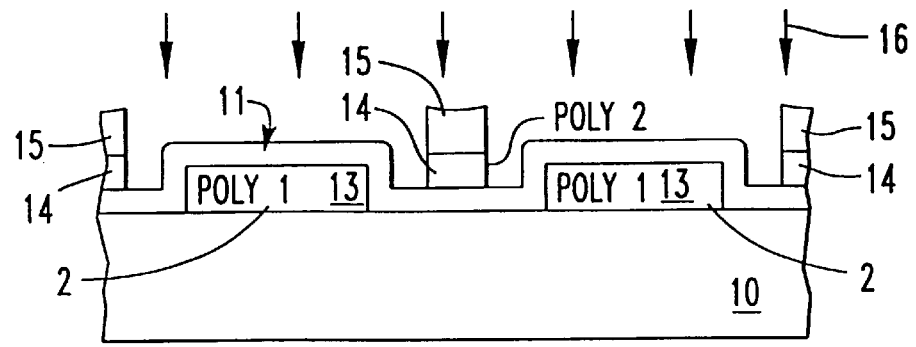
FIG. 4 shows the structure of FIG. 3 after an etching step and also indicates an implantation step.

After planarization, the remaining plugs 15 of resist material form an etchant mask over the area beneath plugs 15. The polysilicon of layer 14 that is not directly beneath a plug 15 is etched away and removed to yield the structure shown in FIG. 4. As shown in FIG. 4, the two lines of first level of polysilicon, 1, 2 are spaced apart and a relatively thin line 14 of the second level polysilicon material is disposed between the lines 1, 2 of the first level of polysilicon 13. At this point, depending upon the process involved, an implantation step will drive an implant 16 into the regions of the substrate 10 disposed on either side of the polysilicon structure 14.

As those skilled in the art will appreciate, the second level polysilicon structure 14 can be used to form a gate electrode of an MOS device. Likewise, the structure 14 may be used to form the emitter of a bipolar device. And, in an integrated circuit having both MOS and bipolar transistors, the second level structure 14 will form the gate in the MOS devices and the emitter in the bipolar devices.

Those skilled in the art will also recognize that the first level polysilicon 13 may be formed of suitably doped material. Alternatively, the polysilicon 13 may be undoped and implanted. In either case, the polysilicon 13 can be used as a source of dopant for changing the conductivity in the region of the substrate 10 underneath the lines 1, 2 of the first polysilicon layer 13. In this manner, one may use the lines 1, 2 of the first polysilicon layer 13 to form source and drain or diffusions for MOS devices and form extrinsic base regions for bipolar devices. Those skilled in the art will also recognize, for bipolar devices, the thin gate oxide 11 beneath the second level polysilicon level 14 may be removed in order to form an emitter in an intrinsic base region.

MOS FABRICATION

Figure 5:
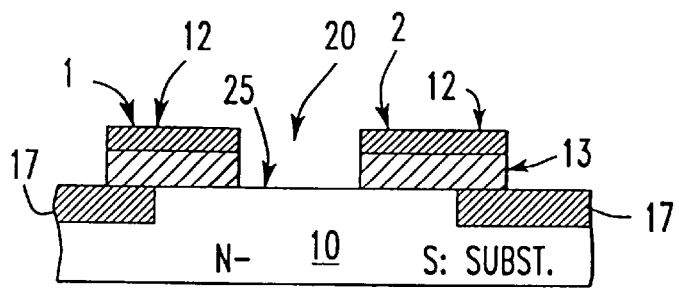
FIG. 5 shows a structure in a PMOS fabrication process that shows a field oxide formed on the substrate and two lines, comprised of a first conductive layer and dielectric layer, which overlap the field oxide.
Figure 6:
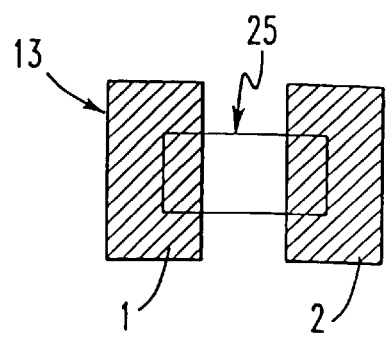
FIG. 6 shows a planar view of the structure shown in FIG. 5.

According to FIGS. 5 and 6, there is more particularly shown a structure 20 adapted for MOS device fabrication, in particular, a PMOS device. The substrate 10 comprises a lightly n-doped silicon. A field oxidation or isolation oxidation 17 will divide or isolate the structure 20 from adjacent devices. Polysilicon 13 is deposited via chemical vapor deposition and the buffer material 12, preferably oxide, is thermally grown and/or deposited. Layers 13 and 12 are then patterned into lines 1, 2. The area 25 is noted as the active area. It will be seen that the lines 1, 2 overlap the active area 25. In the preferred embodiment, the lines 1, 2 comprise heavily doped p-type polysilicon. Doped polysilicon 13 may be deposited on the substrate 10 or undoped polysilicon may be implanted with suitable dopant, e.g., boron for p-type doping or arsenic for n-type doping.

Figure 7:
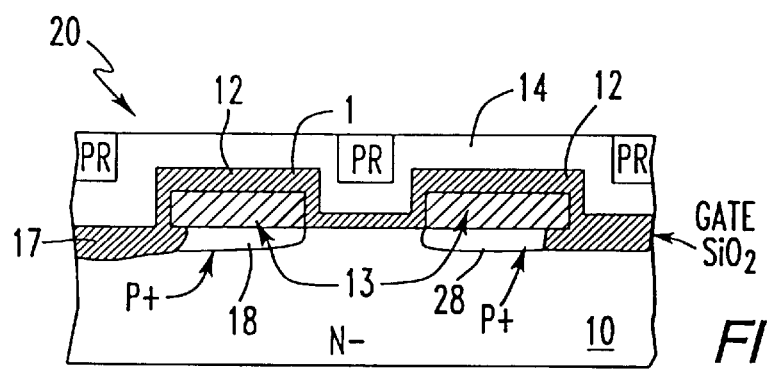
FIG. 7 shows a structure in a PMOS process corresponding to the structure of FIG. 1.

With reference to FIG. 7, the MOS structure is shown at a further step in fabrication. There, the substrate 10 has been subjected to a heating step sufficient to cause the p-type dopant to diffuse from the polysilicon lines 1, 2 into substrate 10 and establish source and drain regions 18, 28. The second level polysilicon 14 has been deposited via chemical vapor deposition and the resist plugs 14 have been formed from the deposited resist and planarization. The second level polysilicon 14 is also heavily doped, either p-type or n-type.

Figure 8:
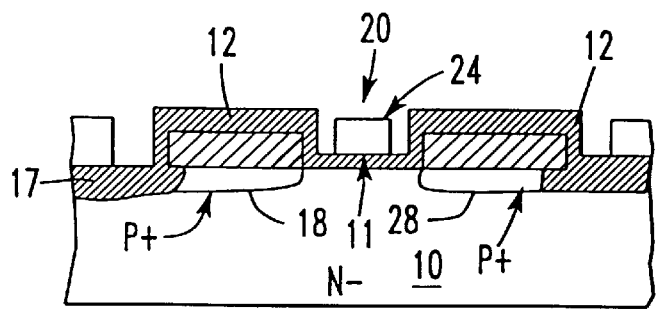
FIG. 8 shows a structure in a PMOS process corresponding to a step following the structure indicated in FIG. 4.
Figure 9:
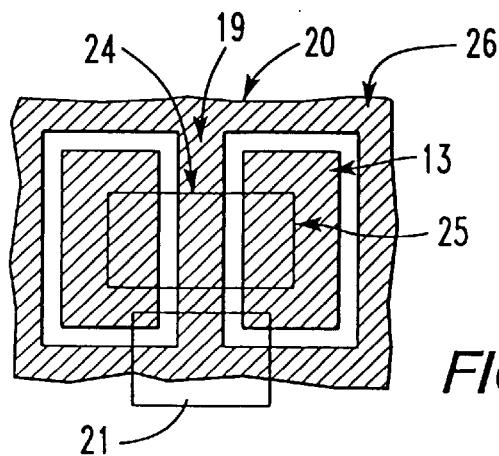
FIG. 9 shows a planar view of the structure shown in FIG. 8.

The MOS structure 20, in particular a PMOS device is shown in FIG. 8. There, a gate 24, formed from the second polysilicon level 14 is suitable for controlling the transit of holes from source region 18 to drain 28. A planar view, shown in FIG. 9 indicates that, if desired, a wider portion of the gate may be formed to provide a gate contact region 21. Such a larger region is desirable for metalization, a later step in the process. The method for forming the gate contact region 21 and other non-gate regions from the second polysilicon layer 14 is to utilize a photoresist masking layer with the appropriate geometry after the formation of the plugs 15 of resist material and prior to the etching of layer 14. Unwanted areas of the second polysilicon layer 14 which remain after etching, such as the so-called stringers 26, may be suitably removed using a second photoresist masking layer with the appropriate geometry protecting the previously formed gate 19 and gate contact region 21. It is also possible that the stringers 26 might, under certain circumstances, remain on the device so long as they do not interfere with the electrical characteristics of the device itself or of adjoining devices.

Figure 10:
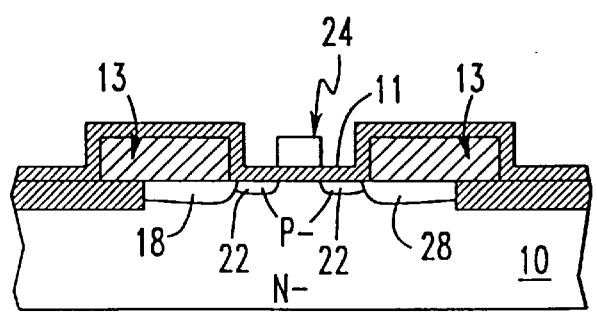
FIG. 10 shows a further step in the PMOS process where lightly doped source and drain are formed.
Figure 11:
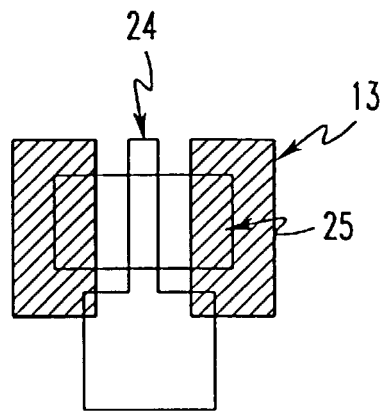
FIG. 11 is a planar view of FIG. 10.

Given the tight geometries of the MOS device, it is often desirable to lightly dope the drain portions of such device. As shown in FIGS. 10, 11 the gate 24 provides a suitable mask for the step of lightly doping the drains via ion implantation to provide lightly doped drain regions 22. Such implantation may occur directly through the thin gate oxide layer 11. The polysilicon gate 24 will absorb the implants and prevent them from shorting out the channel underneath the gate. Those skilled in the art will also appreciate that, if desired, the sources and drains may also be silicided to increase the conductivity of the device in FIG. 10.

BIPOLAR FABRICATION

Figure 12:
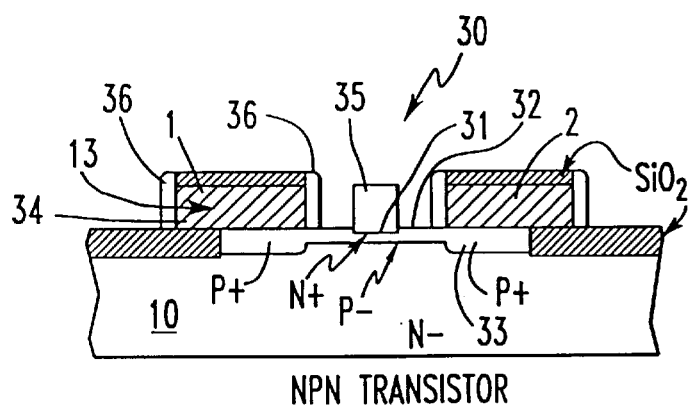
FIG. 12 is a cross sectional view of a bipolar transistor formed using the process shown in FIGS. 1–4.
Figure 13:
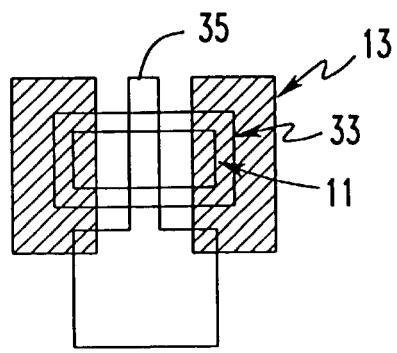
FIG. 13 is a planar view of the structure shown in FIG. 12.

Those skilled in the art will appreciate that the foregoing structures and steps illustrated in FIGS. 1–11 are compatible with the formation of a bipolar transistor. A typical, bipolar transistor 30 is shown in FIG. 12. The NPN transistor 30 has a suitable buried or diffusion-under-field (DUF) layer and collector contact, not shown. The NPN transistor 30 has a polysilicon emitter 35. Emitter 35 is implanted with n-type material, e.g., arsenic which will out diffuse into the substrate 10 and form an emitter region 31. One difference between the NPN transistor 30 of FIG. 12 and the prior MOS structures 20 is that the thin gate oxide layer 11 on the substrate has been removed. This removal occurs prior to the deposition of polysilicon layer 14. In addition, suitable sidewall oxide spacers 36 have been provided on the lines of polysilicon 1, 2 in order to insulate those lines. The polysilicon lines 1, 2 contain heavily doped p-type material that is suitably diffused out of the polysilicon layer 13 in order to form the extrinsic heavily doped p+ base region 33. The intrinsic lightly doped base region 32 is suitably formed by ion implantation, preferably prior to the deposition of polysilicon layer 14 and before or after the formation of the gate dielectric 11.

JFET FABRICATION

Figure 14:
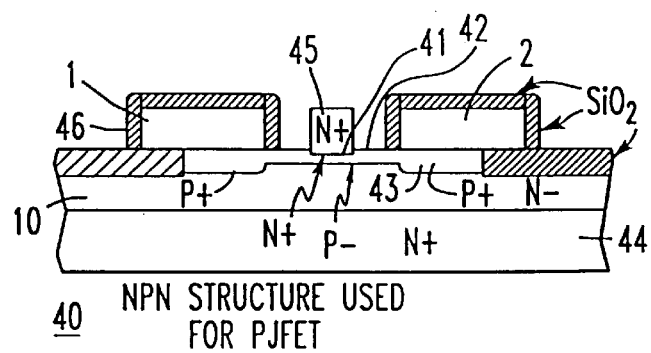
FIG. 14 is a cross sectional view of a PJFET transistor also formed in accordance with the steps shown in FIGS. 1–4.
Figure 15:
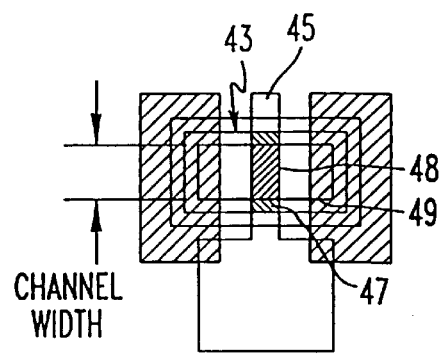
FIG. 15 is a planar view of the structure shown in FIG. 14.
Figure 16:
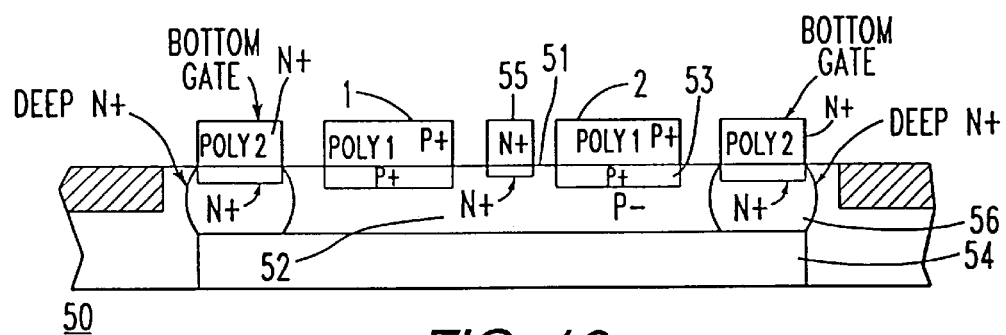
FIG. 16 is a cross section view of an alternate form of the PJFET transistor formed in accordance with the steps shown in FIGS. 1–4.
Figure 17:
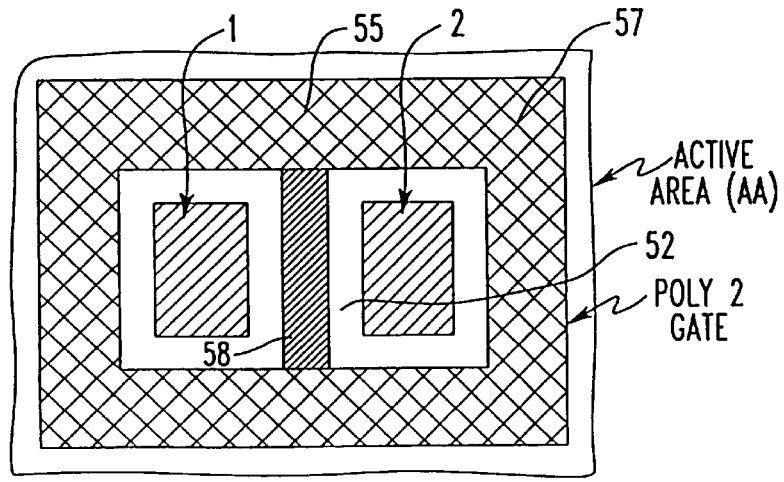
FIG. 17 is a planar view of the structure shown in FIG. 16.

The cross section of the NPN transistor 30 is substantially identical to the cross section of a PJFET transistor 40 shown in FIG. 14. For the PJFET transistor 40, however, the polysilicon lines 1, 2 form the source and drain contact regions, respectively. Out diffusion of N-type dopant 41 from the polysilicon gate 45 forms the top gate of the structure. The channel 42 of the device is formed from the intrinsic base implant. The bottom gate of the structure is formed from the substrate 10 which is a lightly doped N-type epitaxial layer deposited on top of a heavily doped N-type buried layer 44. The planar view of the PJFET from FIG. 14 is shown in FIG. 15. This view indicates that the polysilicon gate 45 forms the top gate contact 48 or the bottom gate contact 47 depending on the location of the intrinsic base implant 49 which is used to form the channel 42 of the PJFET device. An alternate form of the PJFET, 50, is shown in cross section in FIG. 16. In this form of the PJFET, polysilicon lines 1, 2 form source and drain contact regions to a lightly doped P-type region 52 which may be epitaxially grown on top of a heavily doped N-type buried layer 54 which serves as the bottom gate. Out diffusion of N-type dopant from the polysilicon gate 55 forms the top gate region 51 between polysilicon lines 1, 2 and also forms a contact to the bottom gate 54 via the deep N+ region 56. A planar view of the PJFET 50 is shown in FIG. 17. This view indicates that the polysilicon gate 55 forms the top gate contact 58 in the region between the polysilicon lines 1, 2 and forms the bottom gate contact in the region 57 outside the polysilicon lines 1, 2. It is also possible to form the channel region 52 by ion implantation. In this case, the region 52 would correspond to a PNP collector implant (in a BICMOS process) and the structure of the PJFET 50 would correspond to the structure of the PJFET 40 assuming that the channel region 52 implant is suitably masked in a manner similar to the intrinsic base implant 49.

Those skilled in the art will appreciate that the above examples for PMOS, NPN and PJFET structures can easily correspond to NMOS, PNP and NJFET structures, respectively, with the appropriate substitution of N-type for P-type regions and P-type for N-type regions. Those skilled in the art will also appreciate that the above described invention can be practice with semiconductor materials other than silicon, including germanium and compound material such as gallium-arsenide.

The above invention has several technical advantages. One advantage is that the gate (emitter) is self-aligned with the source and drains (base). As such, the formation of lines of polysilicon 1, 2 in the initial step both locates and helps from the ultimate gate region and/or emitter region. Another advantage of this invention is that there is no particular need for barrier metals such as silicide or tungsten. Still another advantage of the disclosed method and apparatus is that both gates and emitters can be formed having relatively narrow dimensions. This ability to form narrow dimensions for gates and emitters substantially increases the overall speed of the electrical devices that are formed in the substrate 10.

Having thus described the preferred embodiment of the invention, those skilled in the art will appreciate that further modifications, additions and changes may be made thereto without departing from the spirit and scope of the invention as set forth in the appended claims.

What we claim is:

1. A MOS transistor having a self-aligned gate comprising, a substrate of semiconductive material of one type of conductivity;

a pair of spaced-apart strips of conductive material disposed on the substrate;

a thin insulating layer disposed between said pair of spaced-apart strips;

a third strip of conductive material having a predetermined thickness and disposed above said insulating layer, between said pair of spaced-apart strips and spaced from each strip a distance approximately equal to the thickness of said third strip.

2. The MOS of claim 1 wherein the pair of strips of conductive material are spaced apart more than one micron and the third strip of conductive material is less than one micron wide.

3. The transistor of claim 1 wherein said gate is less than one micron wide.

4. The transistor of claim 1 wherein the base contact strips are spaced apart more than one micron and the emitter contact is less than one micron wide.

5. The MOS transistor of claim 1 wherein the pair of space-apart strips has a conductivity opposite the conductivity of the substrate.

6. A bipolar transistor having a self-aligned emitter contact comprising, a substrate of semiconductor material of one type of conductivity and having a collector region and a collector contact;

a base contact comprising a pair of spaced-apart strips of conductive material forming a base contact and contacting a region of the substrate having an opposite conductivity to the one type of conductivity of the collector region;

an emitter contact comprising a third strip of conductive material having a predetermined thickness and contacting a region of the substrate having a conductivity similar to that of the collector region of the substrate, said emitter contact disposed above said substrate, between said pair of spaced apart strips that form the base contact and spaced from each base contact strip a distance approximately equal to the thickness of said third, emitter contact strip.

7. The transistor of claim 6 wherein the emitter contact is less than one micron wide.

8. The bipolar transistor of claim 6 wherein the pair of space-apart strips has a conductivity opposite the conductivity of the substrate.

9. A JFET comprising, a substrate of semiconductor material of one type of conductivity and having a buried layer forming a bottom gate region;

first and second conductive strips, said first strip disposed on a region of the substrate having a doping of a type opposite to the one type of conductivity of the substrate and the second layer being of a type similar to the substrate;

source and drain contacts comprising first and second spaced-apart strips of the first layer of conductive material;

a top gate contact comprising a first strip of the second layer and disposed between the first and second spaced-apart strips of said first layer and spaced from each first layer strip a distance equal approximately to the thickness of said second layer;

at least one bottom gate contact comprising a second strip of said second layer and disposed spaced from one of said first or second strips of said first layer by a distance equal approximately to the thickness of the second layer.

10. The JFET of claim 9 further comprising a second bottom gate contact comprising a third strip of the second layer, said third strip disposed spaced from the other of said first and second spaced-apart strips of said first layer and spaced from said other first layer strip a distance equal approximately to the thickness of said second layer.

11. The JFET of claim 9 comprising a top gate contact and two bottom gate contacts disposed in the second layer of conductive material.

12. The JFET of claim 9 wherein the substrate comprises silicon and the two layers comprise polysilicon.

13. The JFET of claim 9 wherein the top gate contact is less than one micron wide.

14. The JFET of claim 9 wherein the source and drain contacts are spaced apart more than one micron and the top gate contact is less than one micron wide.

15. The JFET transistor of claim 9 wherein the pair of space-apart strips has a conductivity opposite the conductivity of the substrate.

16. A transistor having three contact terminals including a control terminal for controlling current between the other two terminals, wherein said control terminal is self-aligned to a least one of the other terminals, comprising:

a substrate of semiconductive material of one type of conductivity;

a pair of spaced-apart strips of conductive material disposed over a region of the substrate having a conductivity opposite to the one type of conductivity and forming at least one of said three contact terminals;

a third strip of conductive material forming another contact terminal, said third strip having a predetermined thickness and disposed between said pair of spaced-apart strips and spaced from each strip a distance approximately equal to the thickness of said third strip.

17. The transistor of claim 16 comprising a field effect transistor wherein the pair of spaced apart strips comprises, respectively, a source and a drain and the third strip comprises the gate.

18. The transistor of claim 16 wherein the pair of space apart strips comprises an emitter and the third strip comprises a base and the transistor is a bipolar transistor.

19. The transistor of claim 16 wherein the pair of space-apart strips has a conductivity opposite the conductivity of the substrate.

20. The transistor of claim 17 further comprising a layer of insulation disposed between the third strip and the substrate and the transistor is a MOS transistor.

21. The transistor of claim 17 wherein the third strip is on the substrate and the transistor is a JFET.

* * * * *